United States Patent [19]

Ogawa et al.

[11] 4,142,124
[45] Feb. 27, 1979

[54] PIEZOELECTRIC CRYSTALLINE ZnO WITH 0.01 TO 20.0 ATOMIC % Mn

[75] Inventors: Toshio Ogawa; Tasuku Mashio, both of Nagaokakyo; Hiroshi Nishiyama, Mukou, all of Japan

[73] Assignee: Murata Manufacturing Co., Ltd., Kyoto, Japan

[21] Appl. No.: 872,342

[22] Filed: Jan. 25, 1978

[30] Foreign Application Priority Data

Jan. 25, 1977 [JP] Japan .................................. 52-6909
Mar. 26, 1977 [JP] Japan .................................. 52-33510

[51] Int. Cl.² .......................................... H01L 41/18
[52] U.S. Cl. .................................... 310/360; 252/62.9
[58] Field of Search .................... 310/360; 252/62.9 R

[56] References Cited

U.S. PATENT DOCUMENTS

| | | | |
|---|---|---|---|
| 3,091,707 | 5/1963 | Hutson | 310/360 |
| 3,440,550 | 4/1969 | Moore | 310/360 X |
| 3,471,721 | 10/1969 | Moore | 310/360 X |
| 3,766,041 | 10/1973 | Wasa et al. | 252/62.9 R |

*Primary Examiner*—Mark O. Budd
*Attorney, Agent, or Firm*—Birch, Stewart, Kolasch and Birch

[57] ABSTRACT

Piezoelectric crystalline films which consist essentially of a crystalline zinc oxide film with a c-axis perpendicular to a substrate surface containing 0.01 to 20.0 atomic percent of manganese with or without 0.01 to 20.0 atomic percent of copper.

2 Claims, 5 Drawing Figures

PIEZOELECTRIC CRYSTALLINE ZnO WITH 0.01 TO 20.0 ATOMIC % Mn

The present invention relates to piezoelectric crystalline films. More particularly, it relates to piezoelectric crystalline films comprising zinc oxide having a hexagonal crystal structure.

There are many methods for making piezoelectric zinc oxide films such as, for example, vacuum deposition methods, epitaxial growth methods, and sputtering methods. Among these methods, the sputtering methods, particularly, a radio-frequency sputtering method has been used very often lately because of the advantage that a growing rate of oriented crystalline films is high, thus making it possible to mass-produce piezoelectric crystalline films industrially.

When making a piezoelectric crystalline film of zinc oxide on a substrate surface with the radio-frequency sputtering method, ceramics of highly pure zinc oxide has been conventionally used as a target. However, even when the radio-frequency sputtering is effected with such a target, it results in the formation of a crystalline film with a rough surface, thus making it impossible to produce a good piezoelectric crystalline film. In addition, it is difficult with such a target to make a c-axis perpendicularly with respect to the substrate surface. If a piezoelectric crystalline film of zinc oxide has a rough surface, various disadvantages occur. For example, when manufacturing an acoustic surface wave filter with such a zinc oxide film, it is difficult to form interdigital transducers on the film surface, and the produced acoustic surface wave filter tends to have the disconnection of interdigital transducers, and possess a large propagation loss of acoustic surface waves. Also, if the c-axis of the zinc oxide film is inclined with respect to the axis perpendicular to the substrate surface, a value of electromechanical coupling factor becomes small, thus making it difficult to produce a piezoelectric crystalline film transducer with good conversion efficiency.

Recently, piezoelectric crystalline films of zinc oxide containing copper have been proposed as crystalline films which overcome the above disadvantages. Such piezoelectric crystalline films can be used effectively at high frequencies, but can not be used at low frequencies since their resistivity is not sufficiently high. Thus, an applicable frequency range of such a piezoelectric crystalline film is narrow.

This is evident from the dielectric relaxation angular frequency ($\omega_c$) which is given by the following equation:

$$\omega_c = \frac{\sigma}{\epsilon_o \epsilon_{ZnO}} = \frac{1}{\epsilon_o \epsilon_{ZnO}\rho_o} \text{ (rad/s)}$$

where
- $\sigma$ = conductivity of crystalline film $[\Omega^{-1}m^{-1}]$
- $\epsilon_0$ = permittivity of vacuum [F/m]
- $\epsilon_{ZnO}$ = permittivity of crystalline film
- $\rho_0$ = resistivity of crystalline film $[\Omega.m]$ In general, it is recognized that the piezoelectric crystalline film posseses piezoelectricity at frequencies where the following relation exists between an angular frequency ($\omega$) and $\omega_c$: $\omega_c << \omega$ ($\omega \approx \omega_c \times 100$). Thus, the piezoelectric crystalline films can be used as piezoelectrics only in a frequency range where the angular frequency ($\omega$) is sufficiently higher than the dielectric relaxation angular frequency ($\omega_c$).

For example, from the above equation, $\omega_c$ for the piezoelectric crystalline film consisting of highly pure zinc oxide (purity: 99.99%) is $$\omega_c = 2\pi f_c = \frac{1}{\epsilon_o \epsilon_{ZnO}\rho_o} \text{ (rad/s)}$$

$f_c = 1.33 \times 10^6$ (Hz) Ps
where
- $\epsilon_0 = 8.854 \times 10^{-12}$ (F/m)
- $\epsilon_{ZnO} = 8.5$
- $\rho_0 = 10^6$ ω.cm Thus, the piezoelectric crystalline films of highly pure zinc oxide can be used at a frequency higher than 100 MHz. In other words, such piezoelectric crystalline films are applicable only at very high frequencies.

Since the piezoelectric crystalline films of zinc oxide containing copper possess resistivity of about $10^8$ to $10^9$ $10^6$ .cm, $f_c$ is $10^3$ to $10^4$ Hz when calculated by the above equation. Thus, the applicable frequencies of such crystalline films are not less than 100 KHz to 1 MHz.

It has now been found that the use of ceramics of zinc oxide containing manganese makes it possible to produce a piezoelectric crystalline film with a c-axis perpendicular to the substrate surface and a smooth surface.

It is an object of the present invention to provide an improved zinc oxide piezoelectric crystalline film which overcomes the aforesaid disadvantages and can be used in a wide range of low to high frequencies.

According to the present invention, there is provided a piezoelectric crystalline film of zinc oxide with a c-axis perpendicular to the substrate surface, characterized in that said crystalline film contains 0.01 to 20.0 atomic percent of manganese.

The piezoelectric crystalline film of zinc oxide according to the present invention may further contain 0.01 to 20.0 atomic percent of copper.

The piezoelectric crystalline film of the present invention may be made by any conventional methods such as, for example, the radio-frequency sputtering methods, the co-sputtering methods and the ion plating methods.

The present invention will be further apparent from the following description with respect to examples and the accompanying drawings, in which.

Figure 1:
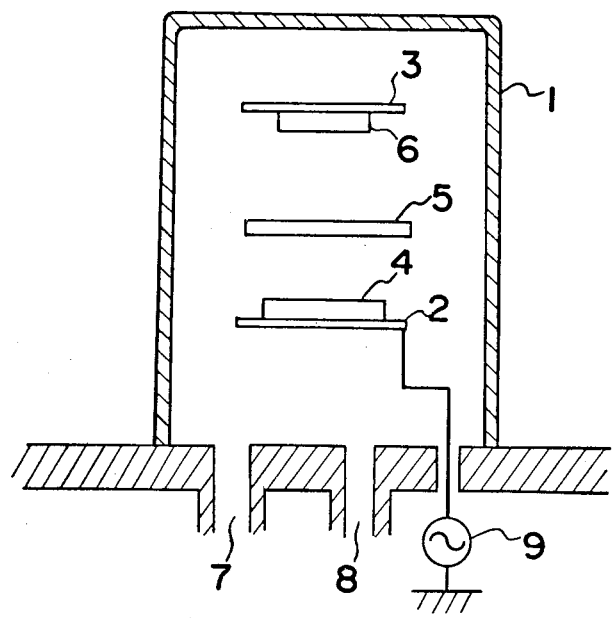
FIG. 1 is a diagrammatic view of the radio-frequency sputtering apparatus used for making piezoelectric crystalline films according to the present invention.

Referring now to FIG. 1, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a target 4 consisting essentially of ceramics of zinc oxide containing manganese or ceramics of zinc oxide containing manganese and copper. Numeral 5 shows a shutter positioned between electrodes 2 and 3. A substrate 6 of glass or metal is fixed to the bottom of the anode 3. The substrate 6 is heated to a temperature of 200° to 500° C. during sputtering. A ventage 7 and a gas inlet 8 are provided to the bell jar 1.

The radio-frequency sputtering is effected in the following manner: After making airtight, the bell jar 1 is evacuated through the ventage 7 to a pressure not higher than $1 \times 10^{-6}$ Torrs, and then supplied with argon or oxygen or a mixed gas of argon and oxygen through the gas inlet 8 whereby adjusting the pressure to $1 \times 10^{-1}$ to $1 \times 10^{-3}$ Torrs. The cathode 2 is applied a radio-frequency voltage by the radio-frequency electric power source 9. An electric power of 2 to 8 W/cm$^2$ is applied to the target 4.

The target consisting essentially of ceramics of zinc oxide containing manganese or ceramics containing manganese and copper is prepared in the following manner:

Using powder of ZnO, MnCO$_3$ (or MnO$_2$) and CuO as raw materials, there are prepared mixtures each having a compositional proportion shown in Table 1. Each of the mixtures is milled by the wet process, dried and then presintered at 600° to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm$^2$ and then fired at 1200° C. for 2 hours to obtain targets. The specimen No. 5 is fired at 1300° to 1400° C.

The thus obtained targets were subjected to measurements of resistivity and percentage of bulk density $d_s$ to theoretical density $d_t$ ($d_s/d_t \times 100$). The results as obtained are shown in Table 1.

Table 1

| Specimen No. | Additive (atom %) Mn | Additive (atom %) Cu | Target Resistivity (Ω.cm) | $d_s/d_t \times 100$ (%) | Zinc oxide film Orientation $\overline{X}$ | Zinc oxide film Orientation $\sigma$ | Zinc oxide film Resistivity (Ω.cm) |
|---|---|---|---|---|---|---|---|
| 1 | — | — | $8.6 \times 10$ | 85 | 5.8 | 5.5 | $3.5 \times 10^3$ |
| 2 | 0.01 | — | $3.1 \times 10^4$ | 90 | 2.7 | 2.5 | $2.8 \times 10^8$ |
| 3 | 2.0 | — | $6.3 \times 10^8$ | 92 | 1.3 | 1.7 | $7.6 \times 10^{10}$ |
| 4 | 10.0 | — | $5.9 \times 10^{11}$ | 95 | 2.2 | 3.3 | $1.3 \times 10^{12}$ |
| 5 | — | 2.0 | $8.9 \times 10^6$ | 87 | 3.2 | 3.4 | $2.3 \times 10^8$ |
| 6 | 0.1 | 0.5 | $3.7 \times 10^8$ | 91 | 1.1 | 2.1 | $1.7 \times 10^{12}$ |
| 7 | 1.0 | 1.0 | $4.3 \times 10^{10}$ | 93 | 0.5 | 1.7 | $8.5 \times 10^{13}$ |
| 8 | 5.0 | 1.0 | $1.2 \times 10^{11}$ | 95 | 0.7 | 2.5 | $3.3 \times 10^{14}$ |

Using the respective targets obtained, zinc oxide piezoelectric crystalline films are made on glass substrates with the aforesaid radio-frequency sputtering apparatus. The radio-frequency sputtering is carried out under the following conditions: A mixed gas of 90 vol % of argon and 10 vol % of oxygen is supplied to the bell jar 1 through the gas inlet 8, whereby adjusting the pressure in the bell jar 1 to $2 \times 10^{-3}$ Torrs. The glass substrate is heated to and kept at 350° C. The target 4 is supplied 6 W/cm$^2$ of an electric power with a frequency of 13.56 MHz.

The c-axis orientation of thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation, vol. 2 (1973) page 84; and Makoto Minakata, The Tohoku University Doctor's Thesis (1974)). The mean value ($\overline{X}$) and standard deviation ($\sigma$) of the angle of c-axis with respect to the axis perpendicular to the substrate surface were obtained from respective specimen. The results are shown in Table 1. The resistivity of the crystalline films are also shown in Table 1.

As is evident from Table 1, the crystalline films according to the present invention have a c-axis approximately perpendicular to the substrate surface and a high resistivity. Also, it will be understood that according to the present invention it is possible to produce excellent piezoelectric crystalline films with a large electromechanical coupling factor.

An applicable frequency range of the zinc oxide piezoelectric crystalline films of the present invention can be obtained by the determination of $f_c$ with the aforesaid equation. The values obtained of $f_c$ with the specimens Nos. 3, 4 and 6 to 8 are ranging from $10^{-2}$ to 100. Thus, the applicable frequency of the piezoelectric crystalline films of the present invention is not less than 1 Hz. This means that the piezoelectric crystalline films of the present invention can be used in a wide range of low to high frequencies. Thus, the piezoelectric crystalline films of the present invention can be applied to low frequency vibrators, for example, a miniaturized tunning fork, and opt electronic devices, for example, a wave guide.

Figure 2:
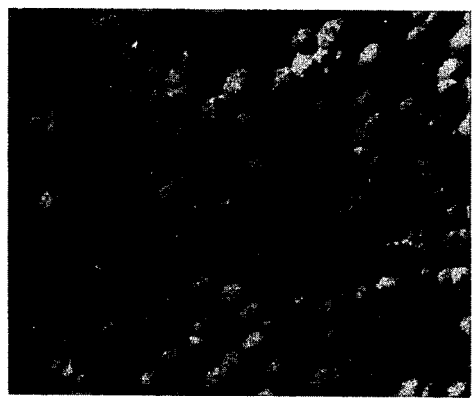
FIGS. 2 and 4 are electron-micrographs of conventional crystalline piezoelectric zinc oxide films.
Figure 3:
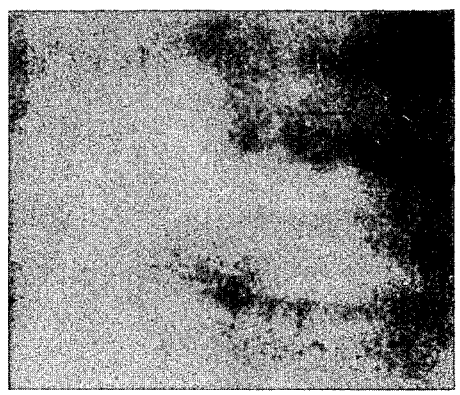
FIGS. 3 and 5 are electron-micrographs of piezoelectric crystalline films of the present invention.
Figure 4:
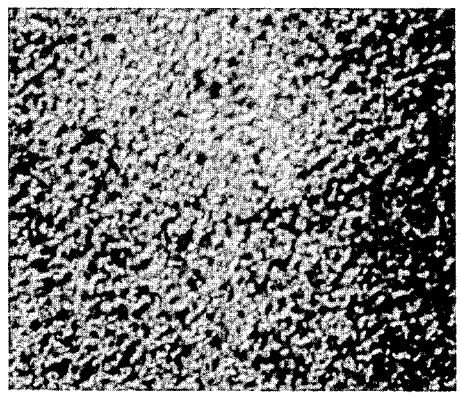

Specimens Nos. 1, 3, 5 and 7 were photographed through a scanning electron microscope at a magnification of 1000. FIG. 2 is an electron micrograph of the specimen No. 1; FIG. 3, that of the specimen No. 3; FIG. 4, that of the specimen No. 5; and FIG. 5, that of the specimen No. 7.

Figure 5:
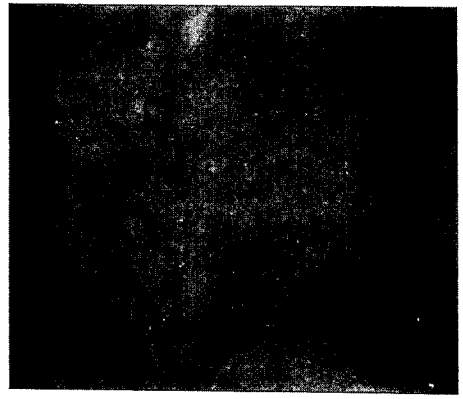

As is evident from these figures, the conventional piezoelectric crystalline films possess a rough surface (cf. FIGS. 2 and 4), while the piezoelectric crystalline films of the present invention possess a smooth surface (cf. FIGS. 3 and 5).

In the above examples, although manganese and copper are used in the oxide forms, there may be used those having other forms such as compounds or alloys of manganese and copper, if the predetermined amounts of manganese and copper can be contained in the resultant zinc oxide piezoelectric crystalline film. The concentrations of manganese and copper in the sputtered zinc oxide films according to the present invention range from 0.01 to 20.0 atomic percent, respectively. If the both concentrations of manganese and copper are less than 0.01 atomic percent, the surface of the resultant crystalline forms become rough, and the resistivity thereof becomes small. If the concentration of manganese or copper is more than 20.0 atomic percent, the direction of the crystallographic orientation of the zinc oxide films can not be well controlled, resulting in the change for the worse in the orientation of the zinc oxide films.

It has been found that by the use of the target containing manganese with or without copper the following advantages can be obtained.

When mass-producing piezoelectric crystalline films industrially by the radio frequency sputtering methods, it is necessary to increase the growing rate of crystalline films. In this case, the electric power supplied to the target per unit area thereof must be increased so that the target is required to have a high bulk density. This requirement is fully met by the target containing manganese with or without copper. As is evident from Table 1, the targets used in the present invention has a bulk density higher than the conventionally used targets so that the targets containing manganese with or without copper make it possible to mass-produce zinc oxide piezoelectric crystalline films by the use of high electric powers.

In addition, athough the firing temperature for preparing conventionally used targets range from 1300° to 1400° C., the incorporation of manganese makes a firing temperature for preparing targets lower, thus making it easy to prepare targets and making the cost down.

What is claimed is:

1. A piezoelectric crystalline film consisting essentially of a crystalline zinc oxide film with a c-axis perpendicular to the substrate surface, characterized in that said crystalline zinc oxide film contains 0.01 to 20.0 atomic percent of manganese.

2. A piezoelectric crystalline film consisting essentially of a crystalline zinc oxide film with a c-axis perpendicular to the substrate surface, characterized in that said crystalline zinc oxide film contains 0.01 to 20.0 atomic percent of manganese and 0.01 to 20.0 atomic percent of copper.

* * * * *